United States Patent [19]
Keeney, Jr. et al.

[11] 3,956,704
[45] May 11, 1976

[54] PULSE GENERATING MEANS

[75] Inventors: Marvin F. Keeney, Jr., Yeadon; Alfred E. Relation, Merion Station, both of Pa.

[73] Assignee: General Electric Company, New York, N.Y.

[22] Filed: Dec. 20, 1972

[21] Appl. No.: 316,964

Related U.S. Application Data

[63] Continuation of Ser. No. 161,260, July 7, 1971, abandoned, which is a continuation of Ser. No. 741,680, July 1, 1968, abandoned.

[52] U.S. Cl. ................................ 328/61; 307/204; 307/219; 307/260; 307/273; 328/155; 331/49; 331/56
[51] Int. Cl.² .................. H03K 1/00; H03K 4/00
[58] Field of Search ........... 307/204, 219, 228, 273, 307/260; 328/59, 61, 63, 155, 181–185; 331/49, 55, 56

[56] References Cited
UNITED STATES PATENTS

| | | | |
|---|---|---|---|
| 2,399,135 | 4/1946 | Miller et al. | 328/207 |
| 2,769,905 | 11/1956 | Ropiequet | 328/185 |
| 3,187,201 | 6/1965 | Eastman et al. | 307/273 |
| 3,195,056 | 7/1965 | Trautwein | 307/273 |
| 3,210,685 | 10/1965 | Zepp | 331/47 |
| 3,456,554 | 7/1969 | Goodwin | 307/273 |
| 3,473,044 | 10/1969 | Moriyasu | 307/273 |
| 3,479,603 | 11/1969 | Overstreet, Jr. | 328/61 |
| 3,530,314 | 9/1970 | Foerster | 307/273 |
| 3,555,434 | 1/1971 | Sheen | 307/273 |

*Primary Examiner*—Stanley D. Miller, Jr.
*Attorney, Agent, or Firm*—Stephen A. Young; Walter C. Bernkopf; Robert A. Cahill

[57] ABSTRACT

Pulses generated by each of two normally synchronized oscillators are combined into a single pulse per cycle by feeding them to a monostable multivibrator and by differentiating the output signal of the monostable multivibrator.

4 Claims, 3 Drawing Figures

U.S. Patent   May 11, 1976   3,956,704
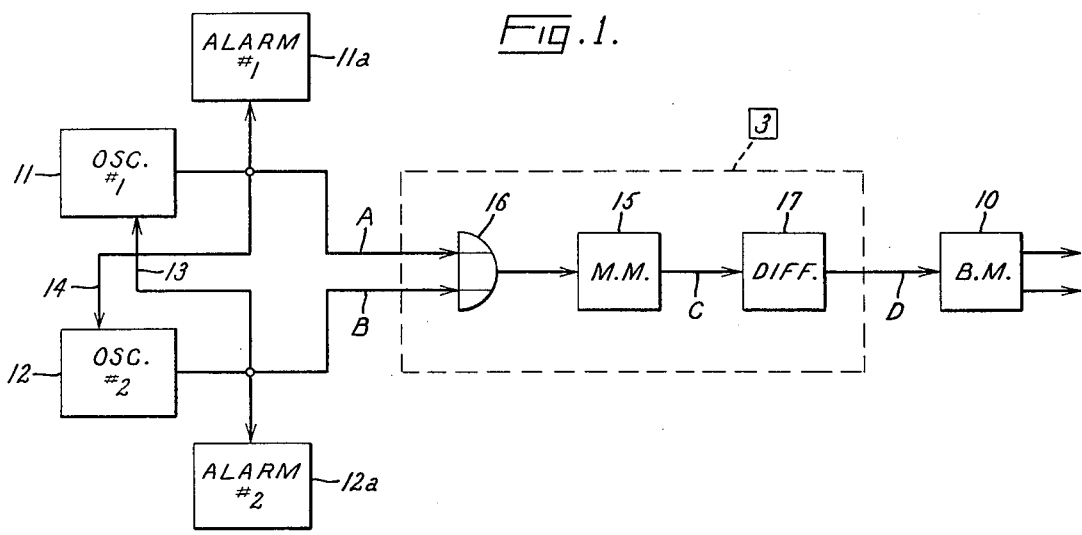
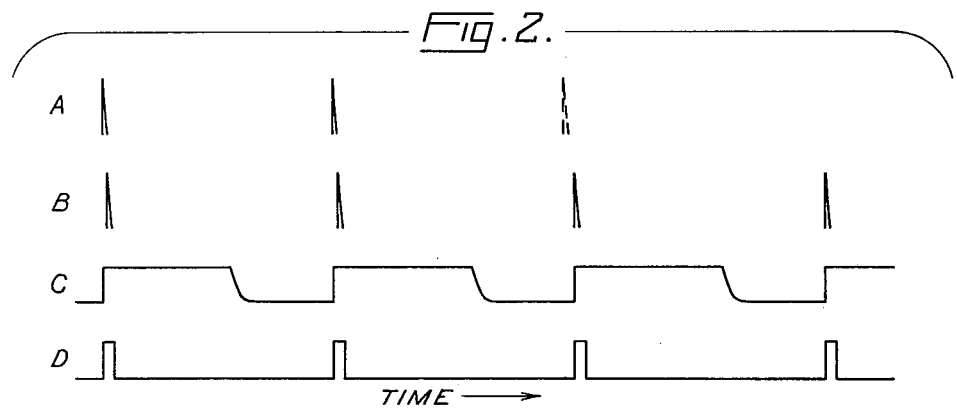
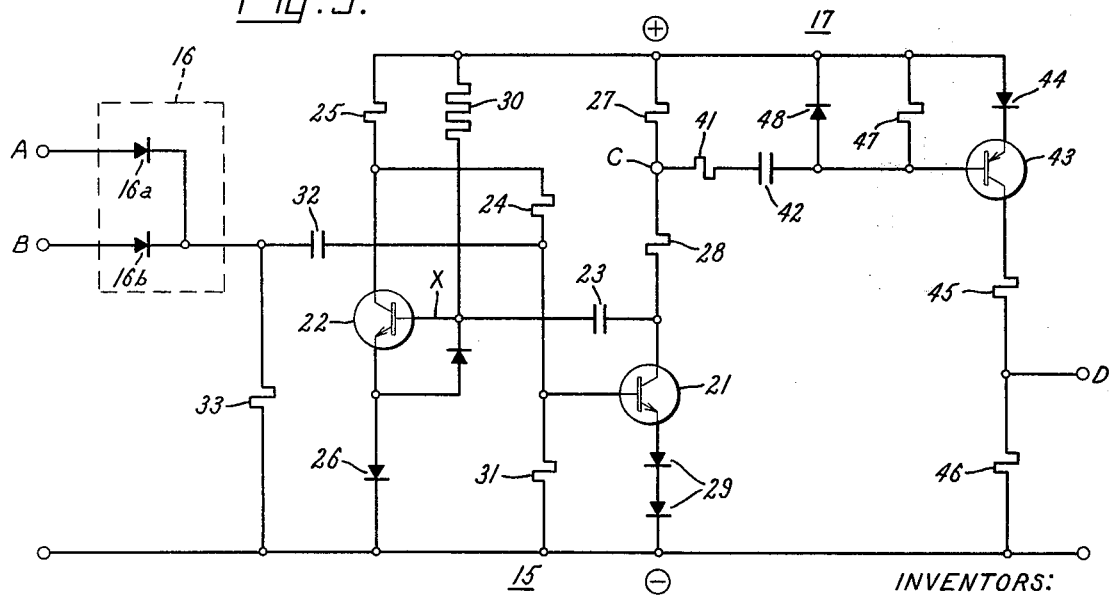
INVENTORS:
ALFRED E. RELATION,
MARVIN F. KEENEY, JR.,
BY Albert S. Richardson Jr.
ATTORNEY

PULSE GENERATING MEANS

This is a continuation of application Ser. No. 161,260, filed July 7, 1971, now abandoned, which is a continuation of 741,680, filed July 1, 1968, abandoned.

This invention relates to novel means for generating a train of electric pulses, and more particularly it relates to such means employing redundant oscillators.

In view of the increasing importance of reliability, redundancy is becoming increasingly popular in the electric power art. Properly designed redundant systems promote reliability by affording a "second chance" in the event of a single component failure in the system. For example, in an uninterruptible power system using static inverters to supply reliable, high quality electricity to critical a-c loads, the inverters can be controlled by means of pulse-like signals derived from a master clock comprising redundant oscillators either of which alone will ensue continuity of service if the other were to fail.

The use of a redundant pair of oscillators in a pulsing control circuit presents a potential problem of false operation due to mismatched oscillators. The control circuit is intended to be activated only once each operating cycle of the oscillators. But so long as both oscillators are in service, their respective pulses may activate the circuit twice a cycle, thereby causing a serious malfunction of the apparatus being controlled.

A partial solution to this problem is to so synchronize the separate oscillators that their respective pulses are produced virtually simultaneously. However, it is difficult to precisely coordinate the operating cycles of two oscillators, and in any event improperly timed pulses are possible under certain transient conditions. Accordingly, the objective of our invention is to provide improved pulse-generating means in which the risk of erroneous operation due to sequential pulses from redundant oscillators is minimized.

In carrying out our invention in one form, we insert between a redundant pair of oscillators and the succeeding control circuitry a monostable multivibrator that is triggered by a pulse from whichever oscillator operates earliest each cycle and that is unresponsive to the operation of the other oscillator for a predetermined interval of time thereafter. Consequently, the latter oscillator does not need to operate simultaneously with the naturally faster oscillator; the monostable multivibrator will ignore or blank out the pulse from the second oscillator and will produce only a single output signal per cycle for the succeeding circuitry. If either oscillator were to fail, the monostable multivibrator will continue producing its output signal in response to pulses received from the remaining sound oscillator alone.

The present invention will be better understood and its various objects and advantages will be more fully appreciated from the following description taken in conjunction with the accompanying drawing in which:

FIG. 1 is a functional block diagram of a preferred embodiment of our improved pulse generating means;

FIG. 2 is a time chart of various signals identified by the letters A through D in FIG. 1; and FIG. 3 is a schematic circuit diagram of a monostable multivibrator and differentiator useful in the pulse generating means shown in block form in FIG. 1.

In FIG. 1 a bistable multivibrator 10, known popularly as a flip-flop, is controlled by a train of pulses derived from a pair of duplicate oscillators 11 and 12. The oscillator 11 is designed cyclically to generate a first discrete control signal A having a controllable frequency of repetition (e.g., 720 hertz), and the redundant oscillator 12 is designed to operate at approximately the same frequency for cyclically generating a second discrete control signal B. Each oscillator is preferably characterized by very good frequency stability. Either control A or B is intended to cause activation of the bistable multivibrator 10 once each operating cycle of the corresponding oscillator, whereby the multivibrator 10 alternately flips and flops in synchronism with the oscillators. The bistable multivibrator 10 is used in a conventional manner to control the operation of succeeding circuitry and apparatus (not shown). With this arrangement failure of either one of the oscillators will not disturb continued operation of the controlled apparatus.

Separate alarms 11a and 12a are respectively associated with the oscillators 11 and 12 to indicate an oscillator failure so that the defective component can be replaced before any trouble develops in the remaining sound one.

Under normal operating conditions, when both of the oscillators 11 and 12 are generating their respective control signals A and B at approximately the same frequency, it is important that only a single activating pulse D be supplied to the bistable multivibrator 10 each cycle. If a surplus or extraneous pulse were allowed to reach the bistable multivibrator 10, the latter component would prematurely flip or flop, thereby causing misoperation of the succeeding circuitry and apparatus. To reduce this possibility, the two oscillators 11 and 12 are normally synchronized so that they operate substantially in unison. The synchronizing or inerlocking means can take any suitable form, such as the cross coupling shown symbolically at 13 and 14 in FIG. 1. Useful examples will be found in the disclosures of prior art patents such as U.S. Pat. No. 3,297,955-Corey et al, and in publications such as the General Electric SCR Manual, pages 79–80 (4th ed., 1967).

With the synchronizing means just described, whichever oscillator has the higher natural operating frequency will actuate the other, whereby the respective control signals A and B are generated almost simultaneously. This is illustrated in FIG. 2, where it is assumed that the second oscillator 12 is the slower one and hence is slaved to the first oscillator 11. Thus the control signals B are shown lagging slightly the control signals A for the first two operating cycles illustrated. Even this slight time discrepancy between the signals A and B is enough to risk malfunction of the bistable multivibrator 10 if it were activated directly by the oscillator outputs. Furthermore, there is always the possibility of a control signal B being generated at an even less propitious time due to erratic behaviour of the oscillator 12 or of the synchronizing means itself. For example, if an initial control signal were generated by the second oscillator on being returned to service following removal for repair or replacement purposes, an extra signal might appear at any time between two consecutive control signals A.

In accordance with our invention, the possibility of such a malfunction is minimized by interposing between the bistable multivibrator 10 and the redundant pair of oscillators 11, 12 a monostable multivibrator 15 which will now be described. The monostable multivibrator 15 is in effect a pulse stretcher. Its input is connected to both of the oscillators 11 and 12 via an OR logic circuit 16, and it is triggered by either of the control signals A and B. When triggered, the monostable multivibrator 15 immediately produces an output signal C which is automatically sustained for at least a predetermined delay time, and any other control signal applied to its input during that time will not affect this component. Consequently only a single output signal C will be produced by the monostable multivibrator 15 during each operating cycle of the redundant oscillators 11 and 12.

The operation of the monostable multivibrator 15 is clearly illustrated in FIG. 2. Periodically it produces a single output signal C when triggered by the control signal A that is generated earliest in each operating cycle of the oscillators. Once produced, the output signal C continues for a predetermined interval of time that is selected to be an appreciable fraction of the length of an operating cycle of the oscillators, and while the signal C subsists the monostable multivibrator is unresponsive to any control signal B. As is shown in FIG. 2 by way of example, the width of each output signal C exceeds 50 per cent of the period of the oscillators. While this is longer than needed in the normal course of steady state operation, it is desirable in practice because of possible transient disturbances.

Since a bistable multivibrator 10 of conventional design is properly activated by relatively short pulses, it is desirable to differentiate the long output signal C of the monostable multivibrator 15. For this purpose a differentiating means 17 is included in the pulse generating means 17. As is shown in FIG. 1, the differentiating means 17 is connected to the output of the monostable multivibrator 15, and as is indicated in FIG. 2 it generates an electric signal D of short duration in response to the leading edge of each output signal C. The train of pulses D is used to activate the bistable multivibrator 10.

It will be apparent from FIG. 2 that whereas both of the cyclic control signals A and B are synchronously generated under normal conditions, the pulse stretching effect of the monostable multivibrator ensures that only one activating pulse D per cycle is supplied to the bistable multivibrator. If the slower oscillator 12 were to fail, the activating pulses D will continue without change. If the faster oscillator 11 were to fail, the activating pulses D will experience only a minor disturbance in timing. To depict the effect of losing the faster oscillator, the third and fourth operating cycles illustrated in FIG. 2 have been shown without control signals A.

FIG. 3 illustrates detailed circuitry of a collector-coupled monostable multivibrator 15 that has been advantageously used in a practical embodiment of our invention. The collector of a normally off transistor 21 is coupled to the base X of a normally on transistor 22 by way of a normally charged capacitor 23. The collector of transistor 22 and the base of transistor 21 are cross coupled by a resistor 24. The normally on transistor 22 spans positive and negative control power terminals to which it is connected by means of a collector resistor 25 and an emitter diode 26. Two resistors 27 and 28 are connected in series between the collector of the normally off transistor 21 and the positive control power terminal, and a pair of diodes 29 are connected between the emitter of this transistor and the negative control power terminal. A resistor 30 that has a relatively high value of resistance is connected from the base X of transistor 22 to the positive control power terminal, and another resistor 31 is connected from the base of transistor 21 to the negative control power terminal.

The circuitry just described has only one permanently stable state and one quasi-stable state, and it is characterized by fast interstate transitions. In its stable state, the transistor 21 is off and there is no current in the resistors 27 and 28. The junction of these resistors is where the output signal C of the monostable circuit appears (shown with inverted polarity in FIG. 2), and since there is no voltage drop across resistor 27 while the circuit is in its stable state, there is normally no output signal.

The monostable multivibrator 15 shown in FIG. 3 is induced to make a transition out of its stable state by applying to the base of transistor 21 a positive triggering signal which turns on this transistor (preferably into saturation). The triggering signal comprises either of the control signals A and B which are respectively generated by the oscillators 11 and 12. These signals, which are spikes of positive voltage (e.g., 15-volt peaks, 4-microsecond widths), are respectively fed to the transistor 21 via associated isolating diodes 16a and 16b and a common coupling capacitor 32. As soon as the transistor 21 is turned on by a triggering signal from either source, its collector potential falls to approximately that of the negative control power terminal, and because of capacitor 23 the normally on transistor 22 is immediately driven completely below cutoff. When the transistor 22 stops conducting, the cross coupling between its collector and the base of transistor 21 ensures that the latter remains forward biased so long as transistor 22 is off even though the original triggering signal has expired. While transistor 21 is on, current exists in the output resistor 27 and the voltage across it abruptly drops with respect to the positive control power terminal. The monostable circuit is now in its quasi-stable state and produces the output signal C (having a 10-volt magnitude, e.g.). Once the circuit has switched to this quasi-stable state, a later triggering signal is ineffectual.

The circuit will remain in its quasi-stable state for only a predetermined delay time because the base X of transistor 22 is connected to the positive control power terminal through the resistor 30 which provides a path for gradually discharging the capacitor 23. When the potential at X rises to the cut-in voltage of transistor 22, this transistor begins conducting again and a regenerative action will take place, turning off transistor 21 and eventually returning the circuit to its initial stable state which continues until the next triggering signal is received. The time duration of the quasi-stable state, and hence the width of the output signal C (e.g., 800 microseconds), depends on the time constant of the series circuit comprising resistor 30 and capacitor 23. If desired, variable impedance can be used to automatically vary this parameter as an inverse function of the operating frequency of the oscillators 11 and 12, whereby the delay time remains an approximately constant fraction of the length of an operating cycle of the oscillators.

The output signal C of the monostable multivibrator 15 is reconverted to an electric signal of relatively short duration by differentiating means 17 which in FIG. 3 is shown as an R-C circuit 41, 42 connected between C and the base of a normally off transistor 43. The emitter of the transistor 43 is connected via a diode 44 to the positive control power terminal, and the collector of this transistor is connected via two resistors 45 and 46 to the negative control power terminal. A resistor 47 is connected between the base and the emitter of the transistor 43 as shown, and a diode 48 across this resistor shunts the discharge current of capacitor 42.

The voltage developed across resistor 46 when the transistor 43 is on comprises the activating signal D for the bistable multivibrator 10 of FIG. 1. The transistor 43 is turned on in response to the leading edge of the monostable output signal C. Transistor 43 remains forward biased for the short time (e.g., 10 microseconds) required by the capacitor 42 to charge up following the drop in voltage across resistor 27.

While the presently preferred form of our invention has been shown by way of illustration, many modifications will no doubt occur to those skilled in the art. For example, the train of pulses D can be used to activate other bistable multivibrators in addition to the one shown in FIG. 1. We therefore contemplate by the claims which conclude this specification to cover all such modifications as fall within the true spirit and scope of our invention.

What we claim as new and desire to secure by Letters Patent of the United States:

1. In combination first and second parallel phase locked redundant oscillators having approximately the same natural frequency and bistable circuit means having an input, each of said oscillators generating a train of triggering pulses of such short duration with respect to its repetition rate or operating cycle that it is possible that during one operating cycle a pulse from one oscillator will fail to overlap with a pulse from the other oscillator and cause said bistable means to separately trigger in response to the pulse from each oscillator over said one operating cycle, wherein the improvement comprises: means electrically coupled to the input of said bistable circuit means and responsive to the train of pulses from each of said oscillators for insuring that only one pulse during each operating cycle is supplied to the input of and triggers said bistable circuit means and any second non-overlapping pulse during said each operating cycle is inhibited from the input of and prevented from triggering said bistable circuit means.

2. The circuit combination of claim 1 in which the responsive means comprises a monostable multivibrator responsive to the triggering pulse generated earliest each cycle for producing an output signal that subsists for at least a predetermined delay time, said monostable multivibrator being unresponsive to any later triggering pulse generated during said predetermined delay time.

3. The circuit combination of claim 2 in which said predetermined delay time is an appreciable fraction of the length of the operating cycle of said oscillators.

4. The circuit combination of claim 2 including differentiating means connected between said monostable multivibrator and said bistable circuit means for converting the leading edge of each output signal to a relatively short electric signal which activates said bistable circuit means.

* * * * *